United States Patent
Tanzawa

(10) Patent No.: US 7,489,556 B2
(45) Date of Patent: Feb. 10, 2009

(54) METHOD AND APPARATUS FOR GENERATING READ AND VERIFY OPERATIONS IN NON-VOLATILE MEMORIES

(75) Inventor: Toru Tanzawa, Tokyo (JP)

(73) Assignee: Micron Technology, Inc., Bosie, ID (US)

( * ) Notice: Subject to any disclaimer, the term of this patent is extended or adjusted under 35 U.S.C. 154(b) by 142 days.

(21) Appl. No.: 11/433,341

(22) Filed: May 12, 2006

(65) Prior Publication Data
US 2007/0263453 A1    Nov. 15, 2007

(51) Int. Cl.
G11C 11/03    (2006.01)

(52) U.S. Cl. .................... 365/185.23; 365/185.24; 365/189.09; 365/211; 365/230.06

(58) Field of Classification Search ............ 365/185.23, 365/185.24, 189.09, 211, 230.06
See application file for complete search history.

(56) References Cited

U.S. PATENT DOCUMENTS

| | | | |
|---|---|---|---|
| 5,229,711 A | 7/1993 | Inoue | |
| 5,377,156 A | 12/1994 | Watanabe et al. | |
| 5,539,690 A | 7/1996 | Talreja et al. | |
| 5,581,504 A | 12/1996 | Chang | |
| 5,673,223 A | 9/1997 | Park | |
| 5,734,609 A | 3/1998 | Choi et al. | |
| 5,828,611 A | 10/1998 | Kaneko et al. | |
| 5,864,504 A | 1/1999 | Tanzawa et al. | |
| 5,912,489 A | 6/1999 | Chen et al. | |
| 6,009,014 A | 12/1999 | Hollmer et al. | |
| 6,018,235 A | 1/2000 | Mikuni | |
| 6,046,944 A | 4/2000 | Singh | |
| 6,147,914 A | 11/2000 | Leung et al. | |
| 6,175,522 B1 | 1/2001 | Fang | |
| 6,255,900 B1 | 7/2001 | Chang et al. | |
| 6,281,743 B1 | 8/2001 | Doyle | |
| 6,323,630 B1 | 11/2001 | Banba | |
| 6,330,195 B2 | 12/2001 | Marr | |
| 6,377,090 B1 | 4/2002 | Bruno | |
| 6,452,437 B1 | 9/2002 | Takeuchi et al. | |
| 6,489,835 B1 | 12/2002 | Yu et al. | |
| 6,489,836 B2 | 12/2002 | Yeong | |
| 6,556,478 B2 | 4/2003 | Willis et al. | |
| 6,559,629 B1 | 5/2003 | Fernald | |

(Continued)

OTHER PUBLICATIONS

Banba et al., "A CMOS Band-Gap Reference Circuit with Sub 1V Operation," Symposium on VLSI Circuits, Digest of Technical Papers, 228-229 (1998).

(Continued)

Primary Examiner—Pho M. Luu
(74) Attorney, Agent, or Firm—TraskBritt

(57) ABSTRACT

Method and apparatus for generating a word-line voltage are disclosed. A word-line voltage generator includes a first current source, an adjustable current source, and a voltage converter, all operably coupled to a current sum node. The first current source generates a first current wherein a voltage derived from the first current at least partially comprises a cell location-dependent temperature coefficient varying with a location of a memory cell in a string of interconnected bit cells. The adjustable current source generates a second current that is substantially independent of a temperature change. The voltage converter is configured for generating a word-line signal having a word-line voltage proportional to the first current.

29 Claims, 17 Drawing Sheets

U.S. PATENT DOCUMENTS

| | | | |
|---|---|---|---|
| 6,567,302 B2 | 5/2003 | Lakhani | |
| 6,603,702 B2 | 8/2003 | Kojima | |
| 6,642,778 B2 | 11/2003 | Opris | |
| 6,650,567 B1 | 11/2003 | Cho et al. | |
| 6,667,904 B2 * | 12/2003 | Takeuchi et al. | 365/185.03 |
| 6,683,481 B1 | 1/2004 | Zhou et al. | |
| 6,693,843 B1 * | 2/2004 | Maffitt et al. | 365/230.06 |
| 6,714,455 B2 | 3/2004 | Banks | |
| 6,738,290 B2 | 5/2004 | Lee et al. | |
| 6,744,676 B2 | 6/2004 | Leung et al. | |
| 6,801,454 B2 | 10/2004 | Wang et al. | |
| 6,847,240 B1 | 1/2005 | Zhou | |
| 6,853,238 B1 | 2/2005 | Dempsey et al. | |
| 6,870,766 B2 | 3/2005 | Cho et al. | |
| 6,934,209 B2 | 8/2005 | Marr | |
| 6,954,394 B2 | 10/2005 | Knall et al. | |
| 6,975,542 B2 | 12/2005 | Roohparvar | |
| 7,005,839 B2 | 2/2006 | Wada | |
| 7,034,514 B2 | 4/2006 | Tachibana et al. | |
| 7,072,238 B2 | 7/2006 | Chae et al. | |
| 7,113,025 B2 | 9/2006 | Washburn | |
| 7,119,528 B1 | 10/2006 | Rasmus | |
| 7,149,132 B2 | 12/2006 | Bedeschi et al. | |
| 7,164,604 B2 | 1/2007 | Arakawa | |
| 7,274,250 B2 | 9/2007 | Hazucha et al. | |
| 7,277,355 B2 * | 10/2007 | Tanzawa | 365/230.06 |
| 2002/0085429 A1 | 7/2002 | Kim et al. | |
| 2004/0130938 A1 | 7/2004 | Hamaguchi | |
| 2005/0078518 A1 | 4/2005 | Nguyen | |
| 2005/0122779 A1 | 6/2005 | Fasoli et al. | |
| 2005/0134345 A1 | 6/2005 | McClure | |
| 2006/0023505 A1 | 2/2006 | Iizuka | |
| 2008/0025121 A1 * | 1/2008 | Tanzawa | 365/212 |

OTHER PUBLICATIONS

Banba et al., "A CMOS Bandgap Reference Circuit with Sub-1-V Operation," IEEE Journal of Solid-State Circuits, 670-674 (1999).

Kuijk, Karel E., "A Precision Reference Voltage Source," IEEE Journal of Solid-State Circuits, 222-226 (1973).

Nozoe et al., "A 256-Mb Multilevel Flash Memory with 2-MB/s Program Rate for Mass Storage Applications," IEEE Journal of Solid-State Circuits, 1544-1550 (1999).

Nozoe et al., "A 256Mb Multilevel Flash Memory with 2MB/s Program Rate for Mass Storage Applications," IEEE International Solid-State Circuits Conference, Digest of Technical Papers, 110-111, 451 (1999).

Pierazzi et al., "Band-Gap References for Near I-V Operation in Standard CMOS Technology," IEEE Custom Integrated Circuits Conference, 463-466 (2001).

Ripamonti et al., "Low Power-Low Voltage Band Gap References for FLASH-EEPROM Integrated Circuits: Design Alternatives and Experiments," IEEE, 635-638 (1999).

Tanzawa et al., "Wordline Voltage Generating System for Low-Power Low-Voltage Flash Memories," IEEE Journal of Solid-State Circuits, 55-63 (2001).

Yen et al., "A Precision CMOS Power-On-Reset Circuit with Power Noise Immunity for Low-Voltage Technology," IEICE Trans. Electron, 778-784 (2004).

* cited by examiner

METHOD AND APPARATUS FOR GENERATING READ AND VERIFY OPERATIONS IN NON-VOLATILE MEMORIES

BACKGROUND OF THE INVENTION

1. Field of the Invention

The present invention relates to non-volatile semiconductor memories. More specifically, the present invention relates to compensating for temperature variations that may occur during operation of the semiconductor memories.

2. Description of Related Art

Non-volatile semiconductor memories are becoming increasingly popular in a wide range of electronic applications from computer systems to personal appliances such as cellular phones, personal digital assistants, cameras, and music players. With the increased popularity, comes increased need for placing larger volumes of data on an individual device and operating the devices with lower power consumption.

Non-volatile memories cells, such as Electrically Erasable Programmable Memories (EEPROMs) and Flash EEPROMs, store information in a field effect transistor (FET) using a floating gate disposed between the substrate and a control gate. FIG. 1 illustrates a flash cell comprising a conventional transistor used in Flash memories. The flash cell 10 includes a drain 12, a source 14, the floating gate 16, and the control gate 18. The floating gate 16 is isolated from the control gate 18 and substrate by dielectric layers formed above and below the floating gate 16. In flash memories, the control gates of a plurality of flash cells are coupled to a word-line. Thus, the signal on the control gate is referred to herein as Vwl, or variations thereof.

Assuming the flash cell is initially erased, the flash cell is programmed by placing charge on the floating gate. Once the charge is stored on the floating gate, it is effectively trapped on the floating gate and remains there even when power is removed. Subsequently, an erase process may be used to remove the stored charge from the floating gate. Programming and erasing are accomplished using a variety of mechanisms well known in the art, such as, avalanche injection, channel injection, and tunneling depending on the structure of the flash cells.

FIG. 2 illustrates current characteristics of a flash cell as a current versus voltage curve. In operation, an erased flash cell exhibits current characteristics as shown by curve 20, which is defined as a binary "1." When the flash cell is programmed, the additional charge on the floating gate moves the current curve for the flash cell to a higher voltage. The more charge stored on the floating gate, the farther to the right the current curve will move. Curve 30 illustrates the current characteristics of a flash cell safely programmed as a binary "0." Curve 25 illustrates the current characteristics of a flash cell that is at a minimum acceptable programming to be considered a "0." Line 40 indicates a current threshold (Ith) at which a sense amplifier distinguishes between a programmed and an unprogrammed flash cell. If a current from the flash cell (Icell) is below Ith, the flash cell will be considered programmed, if Icell is above Ith, the flash cell will be considered unprogrammed. In other words, there is a threshold voltage (Vth), represented by line 50, at which the flash cell conducts a high enough current for the sense amplifier to detect. Thus, after programming, a flash cell may be read by applying a voltage that is midway between an unprogrammed voltage and a programmed voltage. With this voltage applied, if a current is sensed, the flash cell is considered unprogrammed (i.e., "1" in this case). If a current is not sensed, the flash cell is considered programmed (i.e., "0" in this case).

FIG. 3 illustrates the margin that may be present in a flash cell that is programmed relative to a voltage used on the word-line during a read process. Curve 25 illustrates the current characteristics of a flash cell that is at a minimum acceptable programming to be considered programmed. After a flash cell is programmed, a verify process may be done. In the verify process, the flash cell is read using a verify word-line voltage (Vwl_v) that is at the highest voltage acceptable to read out a programmed flash cell to give a current Icell below the threshold current Ith. If a flash cell is not detected as programmed after this verify process, the cell may be programmed again, or it may be marked as a bad cell and replaced with a spare cell. In other words, Vwl_v indicates the highest voltage possible on the word-line to read a cell as unprogrammed. Thus, when the flash cell is read during a normal read operation word-line voltage (Vwl_r) less than Vwl_v is used to ensure that there is margin for distinguishing between a programmed and an unprogrammed flash cell. This margin is illustrated as a "verify margin."

As stated earlier, the current characteristics of a flash cell may change with changes in temperature. FIG. 4 illustrates this change. Curve 25L illustrates a flash cell programmed at a low temperature. Line Vwl_v(LT) indicates that the flash cell may be verified to be at an acceptable level at the low temperature. However, when the device is at a higher temperature, the flash cell exhibits current curve 25H. At the higher temperature, the highest voltage at which the flash cell may be verified to be programmed is indicated as Vwl_v(HT). Thus, if the read word-line voltage Vwl_r is at the same voltage for both low and high temperatures, a flash cell programmed at a low voltage, but read at a high voltage, has a decreased verify margin, as indicated in FIG. 4. Since the current characteristics of a flash cell may change with changes in temperature, this temperature change may reduce the margin available for distinguishing between a programmed and unprogrammed flash cell.

Furthermore, the location of a cell in a series chain of flash memory cells dictates the threshold voltage of the memory cell. A change in temperature also results in a change in the current flowing through the series chain of memory cells. In FIG. 5, a NAND flash array is comprised of an array of floating gate cells 87 arranged in series cell chains 88, 89. Each of the floating gate cells are coupled drain-to-source in the series cell chains 88, 89. Word-lines (WL_0-WL_15) that span across multiple series cell chains 88, 89 are coupled to the control gates of every floating gate cell in order to control their operation.

In operation, the word-lines (WL_0-WL_15) select the individual floating gate memory cells in the series cell chains 88, 89 to be written to or read from and operate the remaining floating gate memory cells in each series cell chain 88, 89 in a pass through mode. Each series cell chain 88, 89 of floating gate memory cells is coupled to a source line 90 by a source select gate 94, 95 and to an individual bit line (BL1-BLN) by a drain select gate 91, 92. The source select gates 94, 95 are controlled by a source select gate control line SG(S) 96 coupled to the control gates. The drain select gates 91, 92 are controlled by a drain select gate control line SG(D) 93.

It can be seen from FIG. 5 that in order to read one memory cell, current must flow through the other memory cells in the series cell chain 88, 89. Therefore, the remaining cells become parasitic resistances in series with either the drain or source connections. Since the cell_0 98 at the bottom of the series cell chain 88 is closest to the array ground, it sees 15 voltage drops in the drain line and one in the source line. The cell_15 97 at the top of the series cell chain 88 sees 15 voltage drops in the source line and one in the drain line.

It is known that the current of any transistor (i.e., memory cell) is determined by the transistor's $V_{gs}$ and $V_{ds}$, depending on the mode of operation. In saturation mode, the current of the cell varies mostly with $V_{gs}$ and is not a function of $V_{ds}$. The transistor current varies with the square of $V_{gs}$. In linear mode, the current through the cell varies with $V_{ds}$.

Assuming a particular cell is operating in saturation mode in order to get the highest gain, it can be seen that the cell_0 98 at the bottom of the series cell chain 88 does not experience a voltage drop on its $V_{gs}$. The cell_15 97 at the top of the series cell chain 88 sees 15 times the voltage drop in the source voltage. Since the cell current is a function of $(V_{gs}-V_1)^2$, the difference in the source voltages is going to be squared in reflection of the cell current change, $V_t$ (i.e., the threshold voltage) being the same.

The relationship between temperature and threshold voltage or $V_t$ level is a function of the location of a cell in the cell string or chain of memory cells. Accordingly, the variations of the threshold voltage or $V_t$ level is not just a function of the temperature, but is also variable with the location of the cell in the cell string over variations in temperature.

Since the current characteristics of a flash cell may change with changes in temperature, this temperature change may reduce the margin available for distinguishing between a programmed and unprogrammed flash cell. Furthermore, since the threshold voltage or $V_t$ level is also a function of the location of the cell in the string of memory cells, there is a need for generating a word-line voltage to increase margin by modifying the word-line voltage depending on temperature, the properties of a flash cell and the location of the flash cell in the string of cells.

DETAILED DESCRIPTION OF THE INVENTION

Method and apparatus for generating a word-line voltage are provided. In one embodiment of the present invention, a word-line voltage generator includes a first current source operably coupled to a current sum node and configured for generating a first current including a cell location-dependent temperature coefficient varying with a location of a memory cell in a string of interconnected bit cells. The word-line voltage generator further includes an adjustable current source configured for generating a second current that is substantially independent of a temperature change and a voltage converter for generating a word-line voltage proportional to the first current.

In another embodiment of the present invention, a method generates a first current including a cell location-dependent temperature coefficient varying with a location of a memory cell in a string of interconnected bit cells. A second current is also generated and is substantially independent of a temperature change. The first and second currents are combined to generate a reference current and the reference current is converted into a word-line voltage by directing the reference current through a voltage converter.

Other embodiments include a semiconductor memory including the word-line voltage generator, a semiconductor wafer including devices having the word-line voltage generator included therein, and an electronic system including a memory device including the word-line voltage generator described herein.

Some circuits in this description may contain a well-known circuit configuration known as a diode-connected transistor. A diode-connected transistor is formed when the gate and drain of a Complementary Metal Oxide Semiconductor (CMOS) transistor are connected together, or when the base and collector of a bipolar transistor are connected together. When connected in this fashion, the transistor operates with voltage to current properties similar to a p-n junction diode. Accordingly, circuit elements illustrated in the figures as diodes may be embodied in any device creating a P-N junction with diode characteristics, such as, for example, a conventional diode, a bipolar transistor connected in a diode configuration, or a CMOS device connected in a diode configuration. Furthermore, suitable devices with diode characteristics may be referred to as diodes, P-N junction elements, diode-connected CMOS transistors, and diode connected bipolar transistors.

The description herein may refer to non-volatile memory cells as Electrically Erasable Programmable Memories (EEPROM) cells, Flash EEPROM cells and flash cells. It should be understood that embodiments of the present invention may be practiced with any of these non-volatile memory cells.

Figure 1:
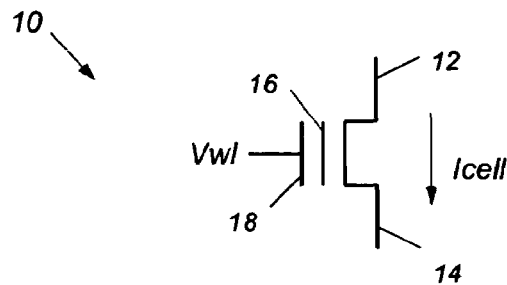
FIG. 1 is a circuit diagram of a flash memory cell.
Figure 2:
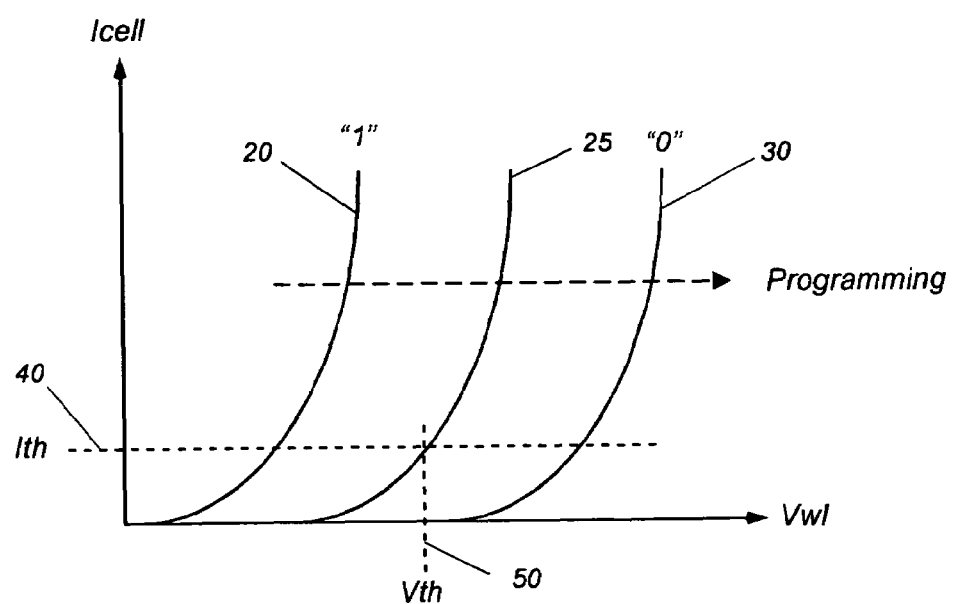
FIG. 2 is a graphical illustration of various currents in a flash memory cell.
Figure 3:
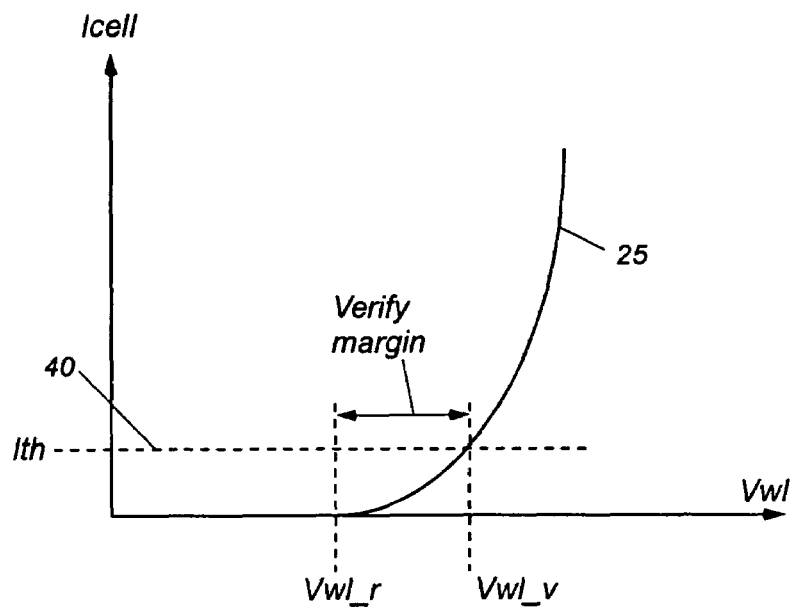
FIG. 3 is a graphical illustration of a verify margin in a flash memory cell.
Figure 4:
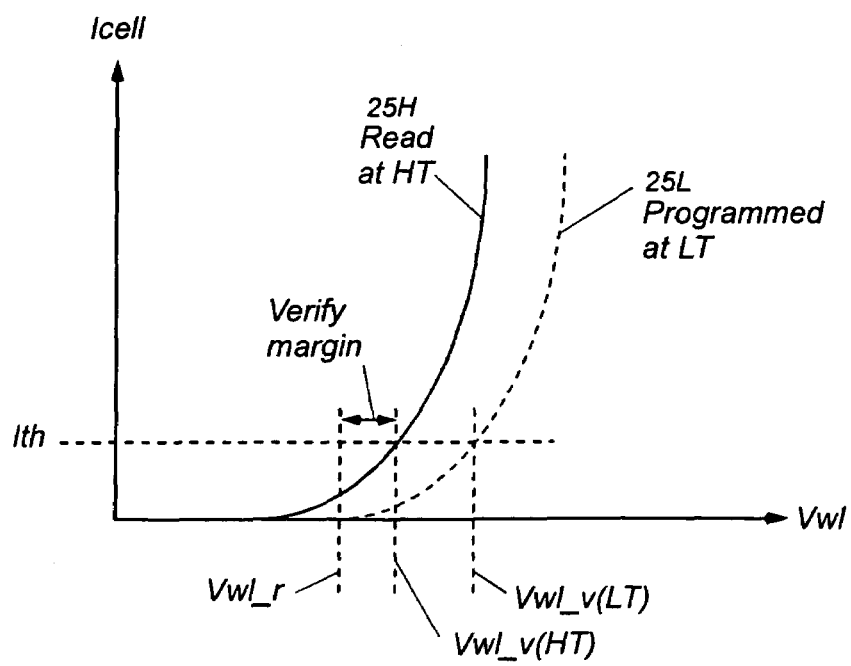
FIG. 4 is a graphical illustration of a reduced verify margin in a flash memory cell.
Figure 6:
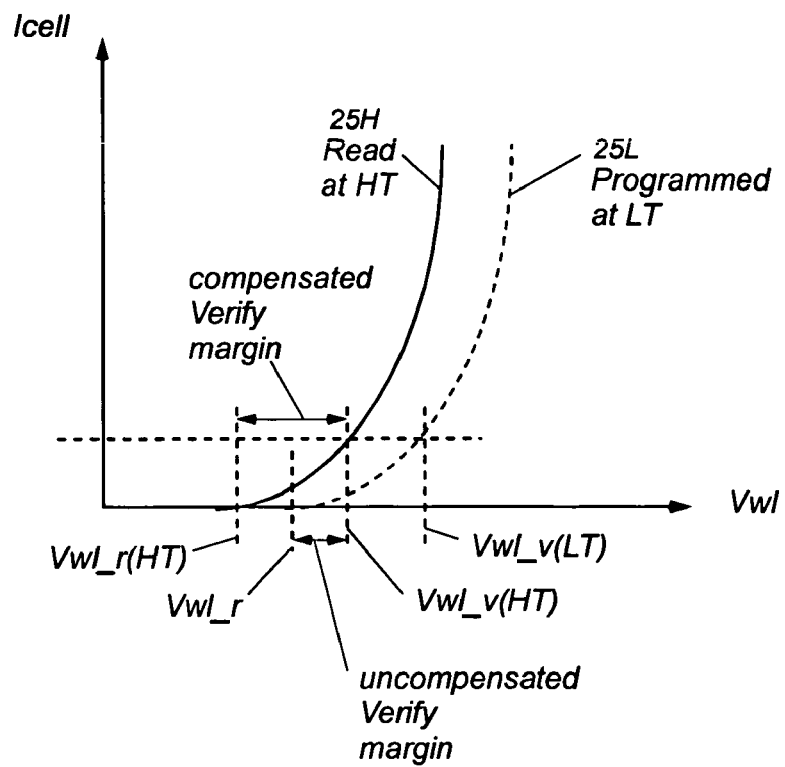
FIG. 6 is a graphical illustration of a compensated verify margin in a flash memory cell.

The present invention, in a number of embodiments, includes circuits and methods for increasing the verify margin by modifying the word-line voltage depending on temperature, the properties of a flash cell, and the location of the flash cell in the string or series chain of flash cells. FIG. 6 illustrates increased verify margin by changing the read word-line voltage Vwl_r for different temperatures and locations of a cell in the string or chain of flash cells. As with FIG. 4, curve 25L illustrates a flash cell programmed at a low temperature and curve 25H illustrates a flash cell read at a high temperature. Vwl_v(LT) indicates the highest voltage at which the flash cell may be verified at a low temperature. Similarly, Vwl_v(HT) indicates the highest voltage at which the flash cell would be verified at a high temperature. Vwl_r illustrates the read word-line voltage when no compensation is performed to try to match the present properties of the flash cell, or compensate for the present temperature. As with FIG. 4, a relatively small verify margin is shown as the "uncompensated verify margin" between Vwl_r and Vwl_v(HT). However, if the word-line voltage at which a read is performed is modified, an increased verify margin is possible. Vwl_r(HT) indicates a modified voltage on the word-line for a read process during a high temperature. By lowering the word-line voltage during the read process, the verify margin is increased as shown by the "compensated verify margin" as the difference between Vwl_v(HT) and Vwl_r(HT).

Figure 7:
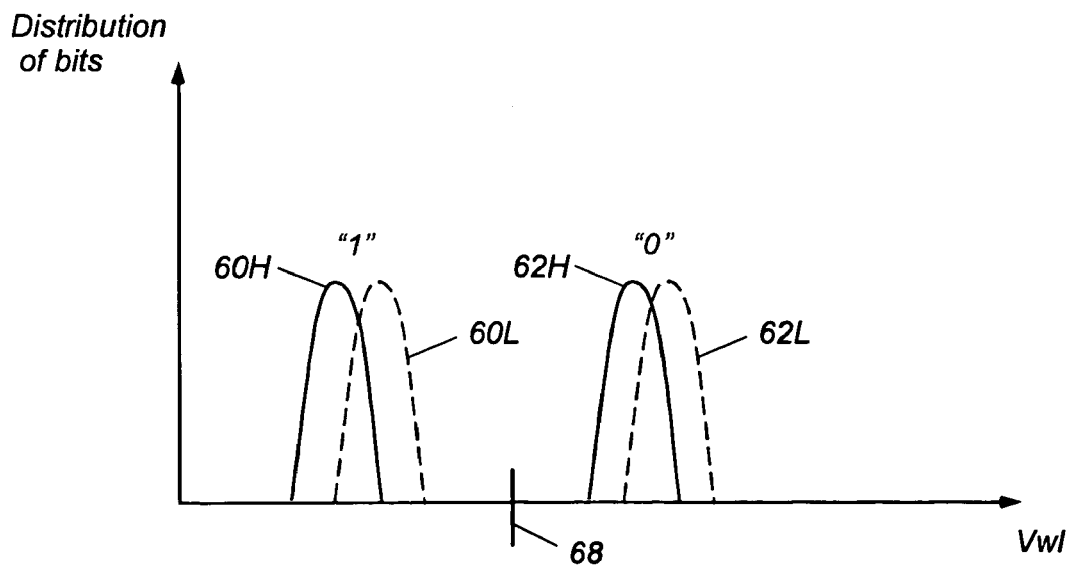
FIG. 7 is a distribution plot of threshold voltages for bi-level flash memory cells.

Another way programmed values for flash cells may be illustrated is as a probability distribution of the threshold voltage on flash cells versus the word-line voltage. FIG. 7 illustrates this distribution for a bi-level flash cell wherein the cell may be at two states (i.e., programmed and unprogrammed). Line 60L illustrates the distribution of Vth for unprogrammed flash cells at a low temperature and line 60H illustrates the distribution of Vth for unprogrammed flash cells at a high temperature. Similarly, line 62L illustrates the distribution of Vth for programmed flash cells at a low temperature and line 62H illustrates the distribution of Vth for programmed flash cells at a high temperature. Line 68 illustrates a voltage level that may be used during a read process to distinguish between an unprogrammed flash cell and a programmed flash cell. FIG. 7 shows the unprogrammed state as a binary "1" and the programmed state as a binary "0." However, those of ordinary skill in the art will recognize that this is an arbitrary definition and the states may be defined the opposite way.

Figure 8:
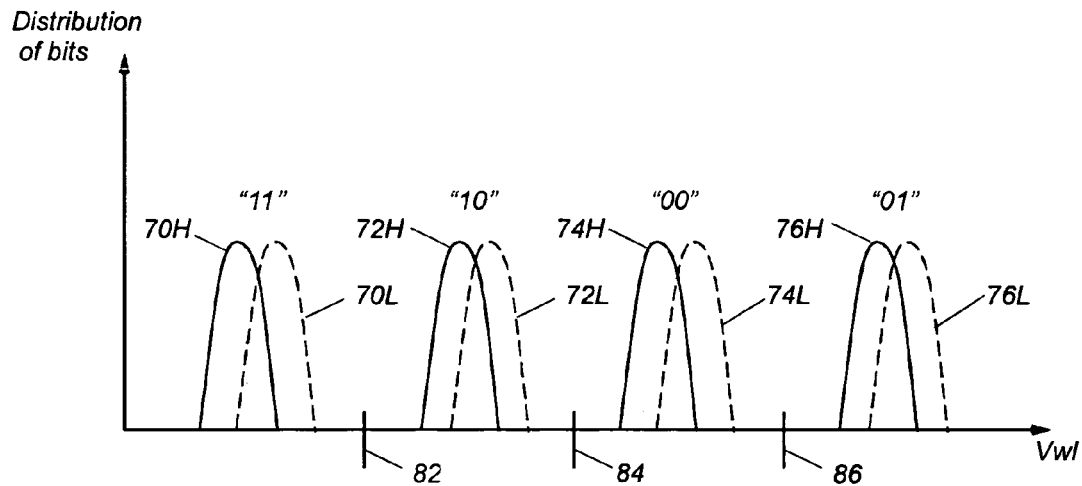
FIG. 8 is a distribution plot of threshold voltages for multi-level flash memory cells.

Flash cells may also be multi-level, wherein the cell may be programmed at multiple Vth levels to indicate more than two binary states. FIG. 8 illustrates a four-level flash cell. The distribution of Vth for flash cells programmed to a "11" state at a low temperature and a high temperature are illustrated by lines 70L and 70H, respectively. Similarly, the distribution of Vth for flash cells programmed to a "10" state at a low temperature and a high temperature are illustrated by lines 72L and 72H, respectively. The distribution of Vth for flash cells programmed to a "00" state at a low temperature and a high temperature are illustrated by lines 74L and 74H, respectively. Finally, the distribution of Vth for flash cells programmed to a "10" state at a low temperature and a high temperature are illustrated by lines 76L and 76H, respectively. Lines 82, 84, and 86 illustrate voltage levels that may be used during a read process to distinguish between the four program levels. FIG. 8 shows one possible assignment for the binary values of the four different distributions. However, those of ordinary skill in the art will recognize that this definition of the states may be defined with other binary combinations. In addition, those of ordinary skill in the art will recognize that a number of states other than two or four are contemplated as within the scope of the present invention.

Figure 9:
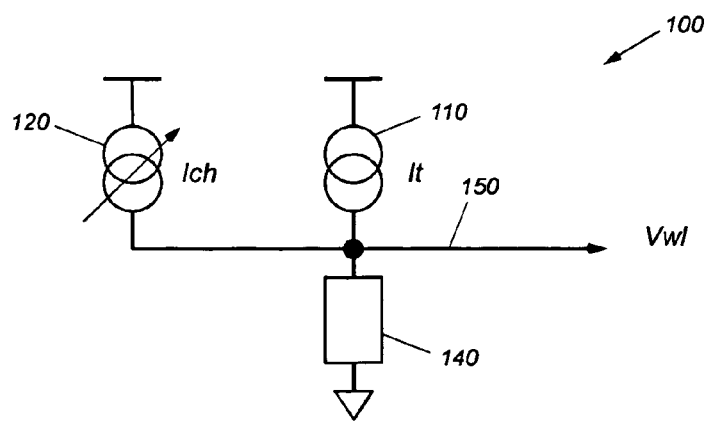
FIG. 9 is a circuit model of a representative embodiment of the present invention.

FIG. 9 is a circuit model of a word-line voltage generator 100 comprising a first current source 110, an adjustable current source 120, and a voltage converter 140. The first current source 110 is operably coupled to a current sum node 150 and is configured for generating a first current (It), wherein a voltage derived from the first current includes a temperature coefficient that is substantially equal to a temperature coefficient of a threshold voltage of a flash cell. In other words, if only the first current source 110 was coupled to the voltage converter 140, the first current source 110 would be configured such that the voltage drop across the voltage converter 140 would be substantially equal to the temperature coefficient of the threshold voltage of a flash cell. Stated even another way; $dVwl/dT = d(R*It)/dT \sim dVt\_cell/dT$, where R is a resistance value of the voltage converter 140 and Vt_cell is the threshold voltage of a flash cell.

The adjustable current source 120 is operably coupled to the current sum node 150 and configured for generating a second current (Ich) that is substantially independent of a temperature change. The first current source 110 and the adjustable current source 120 combine to generate a reference current on the current sum node 150. The voltage converter 140 is configured to create an IR drop proportional to the current on the current sum node 150 by dropping the reference current across a converter element such as a resistance element.

The first current source 110, will adapt and modify the amount of current sourced onto the current sum node 150 depending on the temperature and properties of the flash cell. Thus, a change in current from the first current source 110 will result in a change in voltage on the word-line. In other words, $I_t$ is a function of temperature (i.e., $I_t = f(T)$) in a manner related to the way Vt_cell is a function of temperature.

The adjustable current source 120 generates a charge current (Ich) (also referred to as a second current) that may be adjusted to have a first source current during a verify operation and a second source current during a read operation. In other words, Ich=A*Ic during a verify operation, or Ich=B*Ic during a read operation. In addition, the adjustable current source 120 is configured to be substantially independent of temperature change so that the adjustable current source 120 does not skew the overall sum current due to a temperature difference between read operations and verify operations.

Therefore, the resulting current on the current sum node 150 is Isum=$I_t$+Ich, or Isum=f(T)+A*Ic during a verify operation and Isum=f(T)+B*Ic during a read operation. This configuration enables the ability to generate a word-line voltage configured to adapt to changes in temperature in the same manner that the flash cells adapt during both read operations and verify operations. Furthermore, the values of A and B may be selected to result in multiple sum currents suitable for generating multiple voltages for a word-line coupled to a multi-level flash cell, in addition to the difference between a read operation and a verify operation at each of the multiple levels.

Figure 10:
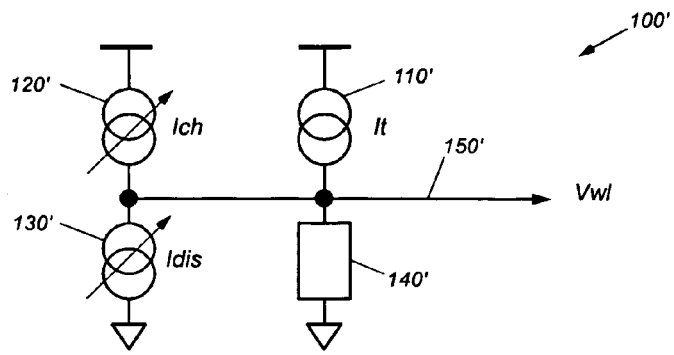
FIG. 10 is a circuit model of another representative embodiment of the present invention.

FIG. 10 is a circuit model of a word-line voltage generator 100' comprising a first current source 110', an adjustable current source 120', and adjustable current sink 130' and a voltage converter 140'. The first current source 110' may be similar to the first current source 110 of FIG. 9 by having a temperature coefficient substantially equal to a temperature coefficient of the flash cell.

The adjustable current source 120' generates a charge current (Ich) that may be adjusted to have a first source current during a verify operation and a second source current during a read operation. In other words, Ich=A*Ic during a verify operation, or Ich=B*Ic during a read operation. In addition, the adjustable current source 120' is configured to be substantially independent of temperature change so that the adjustable current source 120' does not skew the overall sum current due to a temperature difference between read operations and verify operations.

Similar to the adjustable current source 120', the adjustable current sink 130' generates a discharge current (Idis) (also referred to as a third current) that may be adjusted to have a first sink current during a verify operation and a second sink current during a read operation. In other words, Idis=C*Id during a verify operation, or Idis=D*Id during a read operation. In addition, the adjustable current sink 130' is configured to be substantially independent of temperature change so that the adjustable current sink 130' does not skew the overall sum current due to a temperature difference between read operations and verify operations.

Therefore, the resulting current on the current sum node 150' is Isum=It+Ich+Idis, or Isum=f(T)+A*Ic+C*Id during a verify operation and Isum=f(T)+B*Ic+D*Id during a read operation. This configuration enables the ability to generate a word-line voltage configured to adapt to changes in temperature in the same manner that the flash cells adapt during both read operations and verify operations.

As a configuration example, the word-line voltage generator 100' of FIG. 10 may be configured with C=0 during a verify operation and with B=0 during a read operation. In that configuration, during a verify operation, the variable current source would contribute a current to the current sum node 150', but the variable current sink would be effectively off. Similarly, during a read operation, the variable current source would be effectively off, and the variable current sink would contribute a sink current to the current sum node 150'. Of course, those of ordinary skill in the art will recognize that many other combinations for the coefficients A, B, C, and D are contemplated within the scope of the invention. Furthermore, the values of A, B, C, and D may be selected to result in multiple sum currents suitable for generating multiple voltages for a word-line coupled to a multi-level flash cell, in addition to the difference between a read operation and a verify operation at each of the multiple levels.

Figure 11:
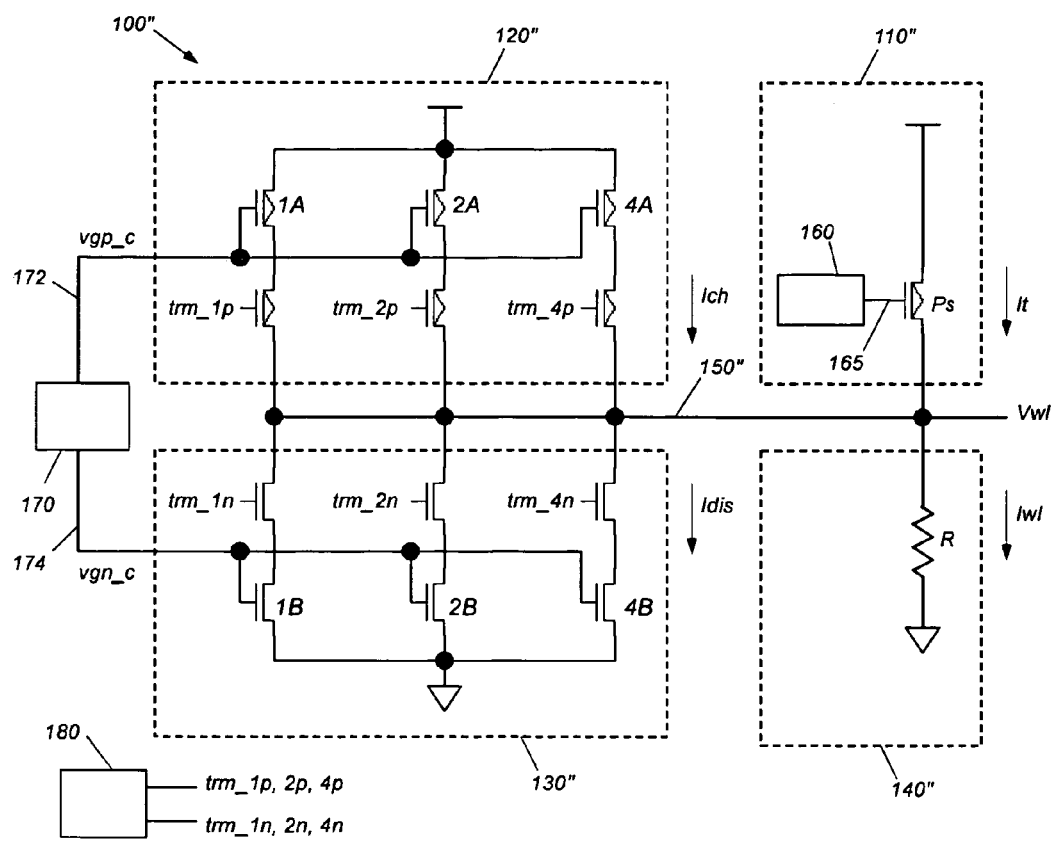
FIG. 11 is a circuit diagram of another representative embodiment of the present invention.

FIG. 11 is a circuit diagram of a word-line voltage generator 100" including a first current source 110", an adjustable current source 120", an adjustable current sink 130", a voltage converter 140", a variable current controller 170, and a variable current selector 180. In operation, the word-line generator may operate similar to the previously discussed embodiments of FIGS. 9 and 10. In the embodiment of FIG. 11, the voltage converter 140" may be implemented as a resistance element R coupled between the current sum node 150" and a ground. In addition, the first current source 110" may be implemented as a p-channel transistor (Ps) with its source coupled to a supply voltage and its drain coupled to the current sum node 150". The gate of p-channel transistor Ps is coupled to a temperature compensated bias signal 165 generated by a matching current controller 160 to control the amount of current flowing through p-channel transistor Ps. The matching current controller 160 is discussed more fully below.

A variable current controller 170 and a variable current selector 180 control the adjustable current source 120" and adjustable current sink 130". The variable current controller 170 is discussed more fully below. The generated signals are operably coupled to the gates of p-channel transistors 1A, 2A, and 4A, and the n-channel transistors 1B, 2B, and 4B, respectively. P-channel transistors 1A, 2A, and 4A are configured with binary weighted gate sizes, such that 2A is twice the size of 1A and 4A is twice the size of 2A. The variable current selector 180 generates the signals trm_1p, trm_2p, trm_4p, trm_1n, trm_2n, and trm_4n. This configuration enables the variable current controller 170 to assert or negate trm_1p, trm_2p, and trm_4p to enable weighted currents onto the current sum node 150". By way of example and not limitation, if p-channel transistor 1A is configured to source 10 µA, p-channel transistor 2A is configured to source 20 µA, and p-channel transistor 4A is configured to source 40 µA, the adjustable current source 120" may be configured to source a current from 0 to 70 µA.

The adjustable current sink 130" operates in a similar fashion by controlling the binary weighted n-channel transistors 1B, 2B, and 4B. Of course, binary weighting is one representative method of creating an adjustable current source 120" and an adjustable current sink 130". Those of ordinary skill in the art will recognize that many other methods may be practiced within the scope of the present invention. In addition, the binary weighting may be increased or decreased to modify the dynamic range of selectable currents. By way of example and not limitation, the binary weighting may be decreased to selections of 0-3 or increased to selections of 0-15.

The variable current controller 170 may fine-tune the amount of current flowing through p-channel transistors 1A, 2A, and 4A by controlling a bias voltage on node 172 (vgp_c). Similarly, the amount of current flowing through n-channel transistors 1B, 2B, and 4B may be fine-tuned by controlling a bias voltage on node 174 (vgn_c). This fine-tuning combined with the variable weighting may be used to create a collective second current Ich that is substantially independent of temperature change, by combining each of the weighted current sources from the variable current source. Similarly, fine-tuning combined with the variable weighting may be used to create a collective third current Idis that is substantially independent of temperature change, by combining each of the weighted current sinks from the variable current sink.

FIGS. 12A-12G are circuit diagrams of various embodiments for the matching current controller 160 of FIG. 11. FIGS. 12A-12D all include a matched current source 163, which includes p-channel transistors P1 and P2 operably coupled in a current mirror configuration and n-channel transistors N1 and N2 operably coupled in a current mirror configuration. This matched current source 163 creates a first current signal I1 through P1 and a second current signal I2 through P2 that have equal currents if the transistors are matched with the same sizes, as is well known for current mirror configurations.

Figure 12A:
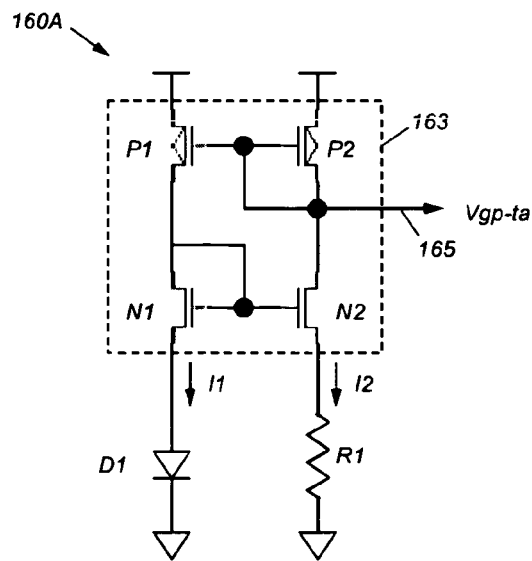
FIGS. 12A-12G are circuit diagrams of various embodiments for a matching current controller.

FIG. 12A illustrates a matching current controller 160A with a negative temperature coefficient. Resistance element R1 creates a predetermined voltage drop and a resultant second current through N2. However, in diodes, P-N junctions have a negative temperature coefficient wherein changes in the voltage drop across the P-N junction are inversely proportional to changes in temperature. In other words, as temperature rises, the voltage drop across a P-N junction falls. For example, for silicon, the voltage drop across a P-N junction is inversely proportional to temperature changes at about −2.2 mV/° C. Therefore, diode D1 exhibits a diode voltage drop that has a negative temperature coefficient. The matching current source operates to keep currents I1 and I2 substantially similar such that the temperature compensated bias signal 165 includes a negative temperature coefficient related to the negative temperature coefficient of diode D1.

Figure 12B:
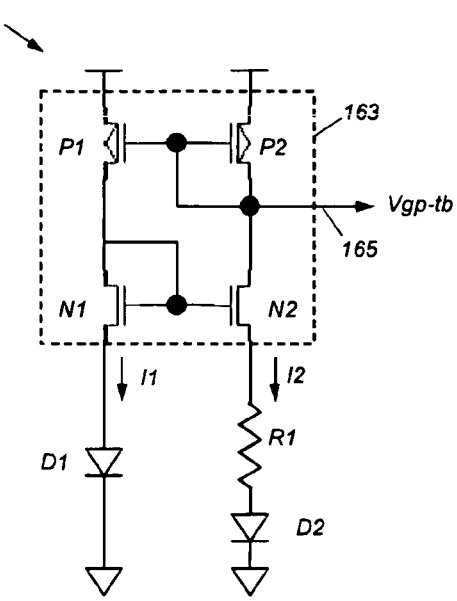

FIG. 12B illustrates a matching current controller 160B with a positive temperature coefficient. Diode D1 and diode D2 may be configured with junction areas of relative size such that Diode D1 has a junction area with a relative size of one, and the diode D2 has a junction area that is N times the size of diode D1. Two diodes of different sizes, but with the same emitter current, will have different current densities and, as a result, slightly different voltage drops across the P-N junction. Due to the negative temperature coefficient for diodes, as temperature rises, the voltage drop of diode D1 decreases at a higher rate than the voltage drop decrease of diode D2. This difference generally may be referred to as $\Delta V_{be}$ indicating that it represents the difference in voltage drop between the two diodes D1 and D2. Therefore, the voltage drop across the first diode D1 is equal to the combination of the voltage drop across the second diode D2 and the voltage drop across resistor R1. Consequently, to keep first current I1 and second current I2 substantially the same, the voltage drop across resistor R1 ($\Delta V_{be}$) has a direct temperature correlation (i.e., voltage change increases as temperature increases). $\Delta V_{be}$ may also be referred to as a voltage that is Proportional To Absolute Temperature (PTAT) because the voltage adjusts in proportion to temperature change with a positive temperature coefficient substantially opposite to the negative temperature coefficient of the diode D1 such that the temperature compensated bias signal 165 remains substantially temperature independent.

Figure 12C:
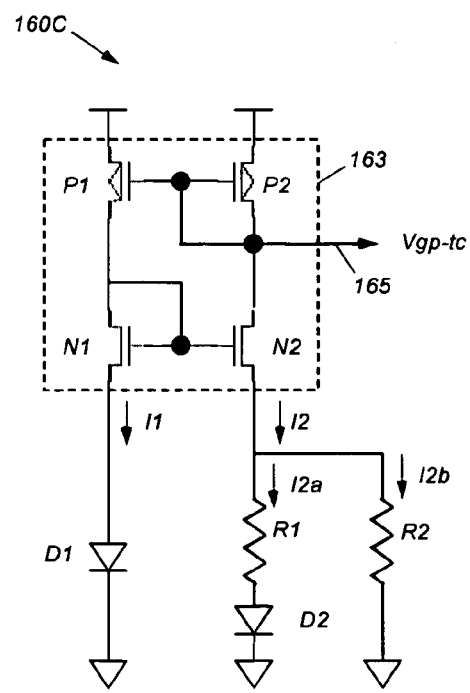

FIG. 12C illustrates a matching current controller 160C with a temperature coefficient between that of the FIG. 12A embodiment and the FIG. 12B embodiment. In operation, the embodiment of FIG. 11C operates similar to the embodiment of FIG. 11B. However, the embodiment of FIG. 11C includes resistor R2. This results in a split of second current I2 into sub-current I2a and sub-current I2b. Sub-current I2a is directly related to temperature change due to the $\Delta V_{be}$ term as explained earlier. Sub-current I2b, on the other hand, operates to increase current I2, resulting in a current I2 that has a positive temperature coefficient with an offset (Iptco), wherein sub-current I2a generates the positive temperature coefficient and the sub-current I2b generates the offset. As a result, the temperature compensated bias signal 165 will have a voltage that is directly related to Iptco. Different resistance ratios between R1 and R2 relative to the transistor sizes of N1 and N2 may be selected to modify the temperature compensated bias signal 165 to different values while still maintaining a substantial independence from temperature changes.

Figure 12D:
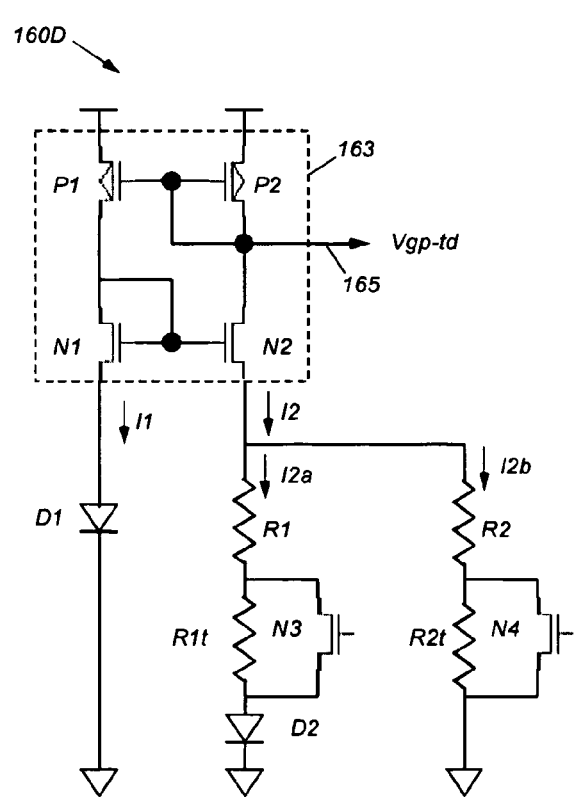

The embodiment of FIG. 12D is similar to the embodiment of FIG. 12C except that matching current controller 160D includes bypass transistors N3 and N4 around resistors R1t and R2t, respectively. This configuration enables a trimming capability to modify the voltage drop due to sub-current I2a flowing through R1, and possibly R1t. Similarly, the voltage drop due to sub-current I2a flowing through R2, and possibly R2t may be modified. Of course, this trimming capability may be expanded to more than one selectable resistor.

Figure 12E:
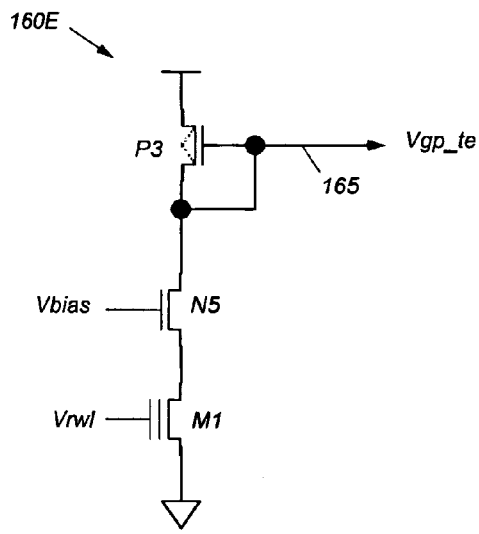

FIG. 12E illustrates a matching current controller 160E using a flash memory cell M1, to model the characteristics of the flash memory cell being selected. P-channel transistor P3 is connected in a diode configuration to create a current source. Flash memory cell M1, may behave with current characteristics, and temperature dependency, similar to the current characteristics of the flash memory cells in the memory array. N-channel transistor N5 may be controlled by a bias voltage Vbias to further modify the current through p-channel transistor P3, and, as a result, the voltage output on the temperature compensated bias signal 165.

Figure 12F:
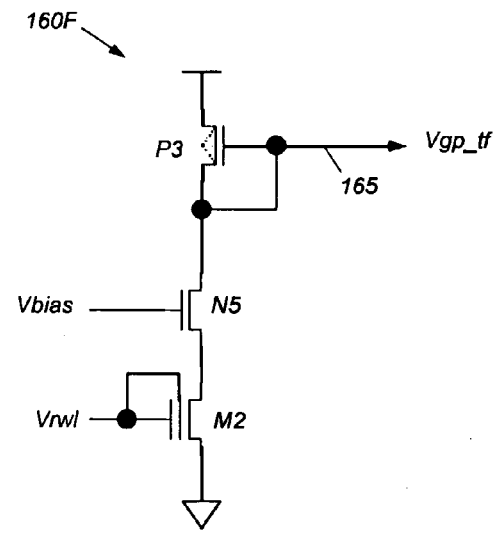

FIG. 12F illustrates a matching current controller 160F using a flash memory cell M2, to model the characteristics of the flash memory cell being selected, similar to the embodiment of FIG. 12E. P-channel transistor P3 is connected in a diode configuration to create a current source. Flash memory cell M2 may behave with current characteristics, and temperature dependency, similar to the current characteristics of the flash memory cells in the memory array. Except in the embodiment of FIG. 12F, the flash memory cell has the control gate and the floating gate operably coupled together. This configuration may more accurately model a programmed flash cell, alleviating the need to provide a mechanism for creating a programming operation for the flash memory cell M2. N-channel transistor N5 may be controlled by a bias voltage Vbias to further modify the current through p-channel transistor P3, and, as a result, the temperature compensated bias signal 165.

Figure 12G:
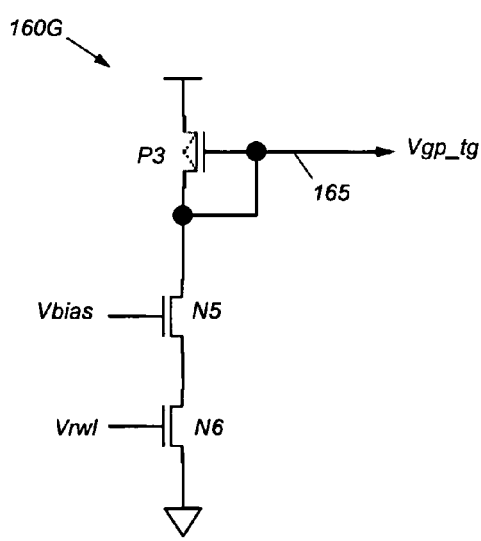

FIG. 12G illustrates a matching current controller 160G using n-channel transistor N6, to model the characteristics of the flash memory cell being selected. P-channel transistor P3 is connected in a diode configuration to create a current source. N-channel transistor N6 may behave with current characteristics, and temperature dependency, similar to the current characteristics of the flash memory cells in the memory array. N-channel transistor N5 may be controlled by a bias voltage Vbias to further modify the current through p-channel transistor P3, and, as a result, the temperature compensated bias signal 165.

Figure 13:
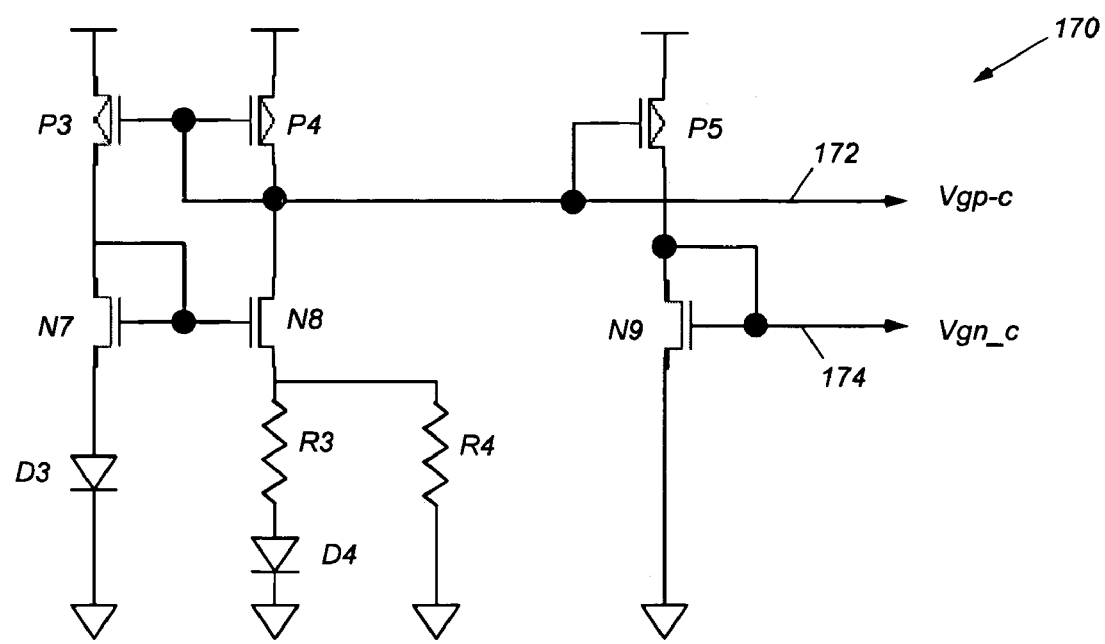
FIG. 13 is a circuit diagram of a variable current controller, in accordance with a representative embodiment of the present invention.

FIG. 13 is a circuit diagram of a representative embodiment of the variable current controller 170 of FIG. 11. P-channel transistors P3 and P4, N-channel transistors N7 and N8, diodes D3 and D4, and resistors R3 and R4 operate to create a positive temperature coefficient with an offset (Iptco) in a manner similar to the matching current controller 160 shown in FIG. 12C. As a result, node 172 (vgp_c) is generated to be substantially independent of temperature variations and creates a bias level for the p-channel transistors of the adjustable current source 120" illustrated in FIG. 11. P-channel transistor P5 and n-channel transistor N9 operate to create a bias signal on node 174 (vgn_c) related to node 172 (vgp_c) at a suitable bias level for the n-channel transistors of the adjustable current sink 130" illustrated in FIG. 11.

As stated, not only does the temperature affect the verify margin through changing current through the individual memory cell, but the current through the memory cell is also affected by the location of the memory cell in the string or chain of memory cells. While the location of a cell in a series chain of flash memory cells dictates the threshold voltage of the memory cell, a change in temperature also results in a change in the current flowing through the series chain of memory cells.

Figure 5:
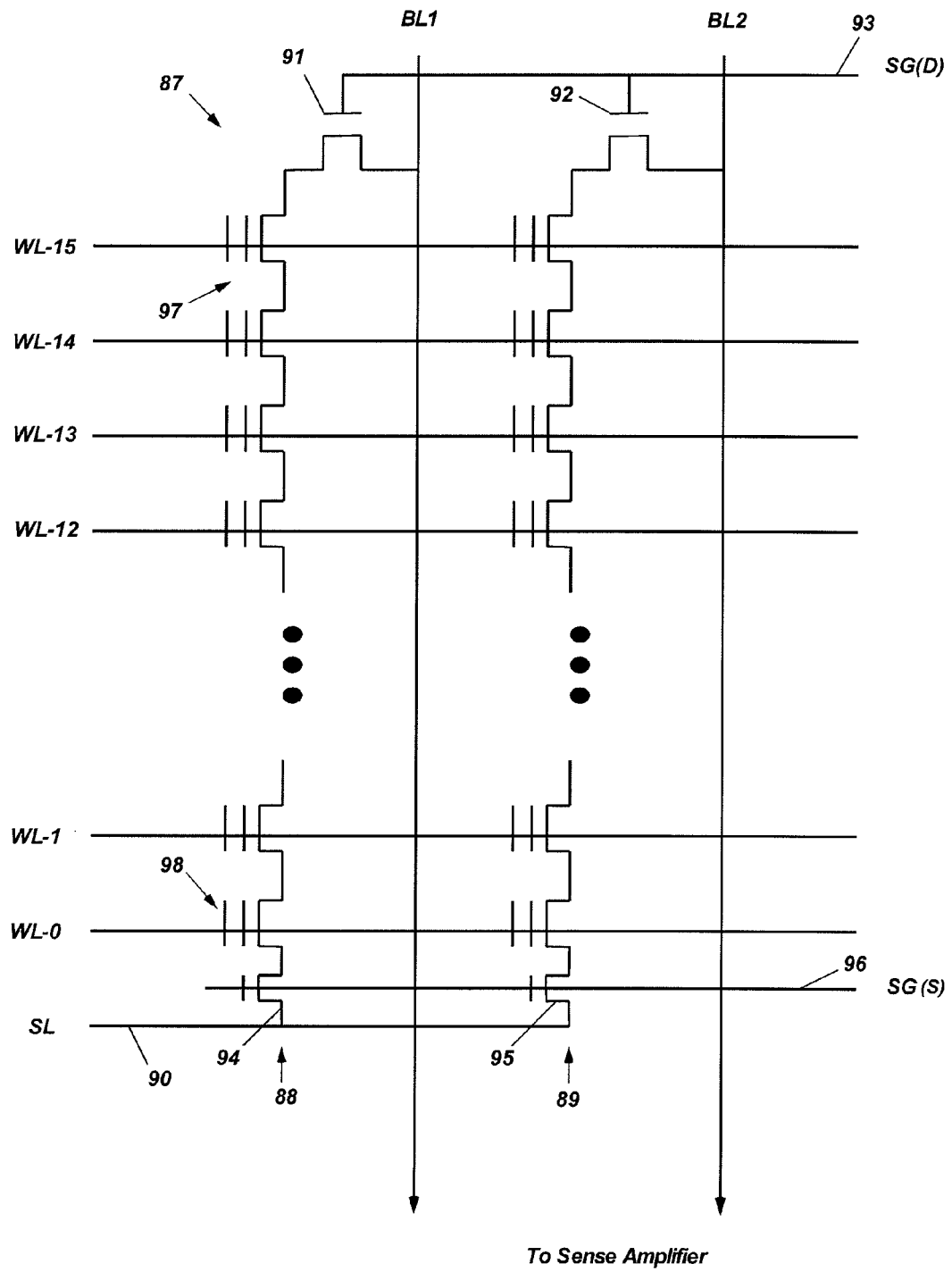
FIG. 5 is a simplified diagram of a portion of a flash memory array illustrating a series chain of flash memory cells.
Figure 14A:
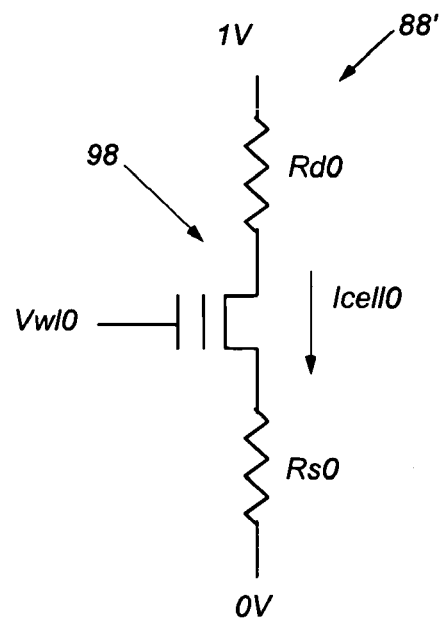
FIGS. 14A and 14B illustrate equivalent circuits of various memory cells in a string or chain of memory cells.
Figure 14B:
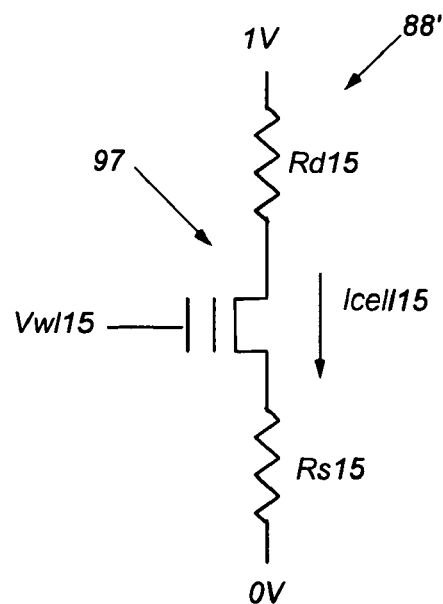

FIGS. 14A and 14B illustrate equivalent circuits for memory cell_0 98 and memory cell_15 97, respectively. As stated with reference to FIG. 5, a NAND flash array is comprised of an array of floating gate cells arranged in strings or cell chains with each of the floating gate cells coupled drain-to-source in the series cell chains 88'. In operation, the word-lines (WL_0-WL_15) select the individual floating gate memory cells in the series cell chains to be written to or read from and operate the remaining floating gate memory cells in each series cell chain in a pass through mode. By way of an example, FIG. 14A illustrates an equivalent circuit when cell_0 98 is selected and each of the other cells is configured in a pass through mode. As illustrated, the resistance above cell_0 98 is identified as $R_{d0}$ and is equivalent to the sum of resistances in the chain of cells. Specifically, $R_{d0}=R_{SGD}+R_{CELL\_15}+R_{CELL\_14}+ \ldots +R_{CELL\_1}$ and $R_{s0}=R_{SGS}$ where $R_{SGD}$ is the resistance of the drain select gate and $R_{SGS}$ is the resistance of the source select gate. Similarly, FIG. 14B illustrates an equivalent circuit when cell_15 97 is selected and each of the other cells is configured in a pass through mode. As illustrated, the resistance above cell_15 97 is identified as $R_{s15}$ and is equivalent to the sum of resistances in the chain of cells. Specifically, $R_{s15}=R_{SGS}+R_{CELL\_14}+R_{CELL\_13}+ \ldots +R_{CELL\_0}$ and $R_{d15}=R_{SGD}$.

It is apparent that in order to read one memory cell, current must flow through the other memory cells in the series cell chain. Therefore, the remaining cells become parasitic resistances in series with either the drain or source connections. Since the cell_0 98 at the bottom of the series cell chain 88' is closest to the array ground, it sees 15 voltage drops in the drain line and one in the source line. The cell_15 97 at the top of the series cell chain 88' sees 15 voltage drops in the source line and one in the drain line.

Figure 15:
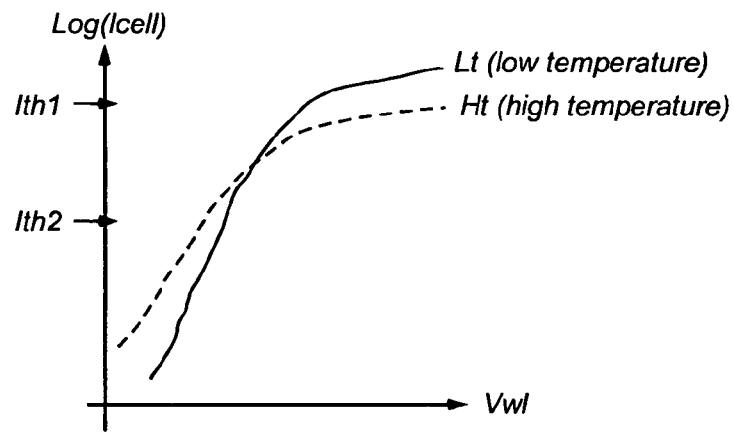
FIG. 15 is a plot illustrating temperature dependence of a cell transistor.

FIG. 15 is a plot illustrating representative current flowing through a memory cell when activated by a word-line voltage, Vwl, over high and low temperature plots. As illustrated, the high temperature (HT) plot and the low temperature (LT) plot of current, in logarithmic scale, do not track each other and create regions identified to have a programmed flash cell current, Icell, with a first threshold current $I_{th1}$ and a second threshold current $I_{th2}$. As is apparent from the plots, there exists a location-dependent temperature coefficient that varies with the location of a cell in a string or chain of interconnected flash memory cells. The temperature dependence of the first threshold current $I_{th1}$ results in $R_{s0}(HT)>R_{s0}(LT)$ and $R_{s15}(HT)>R_{s15}(LT)$ with the temperature dependence of Vt due to that of Rs being $|dVt0/dT|<|dVt15/dT|$. The temperature dependence of the second threshold current $I_{th2}$ results in $R_{s0}(HT)<R_{s0}(LT)$ and $R_{s15}(HT)<R_{s15}(LT)$ with the temperature dependence of Vt due to that of Rs being $|dVt0/dT|<|dVt15/dT|$.

Figure 16A:
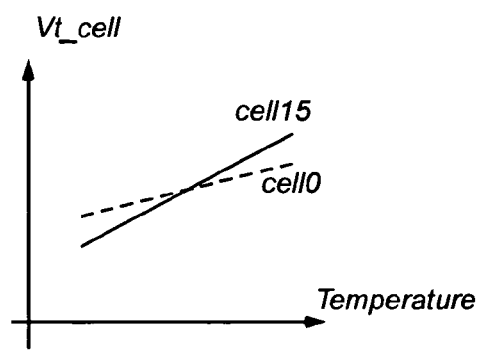
FIGS. 16A and 16B are plots illustrating temperature dependence of various cells in a string or chain of memory cells.
Figure 16B:
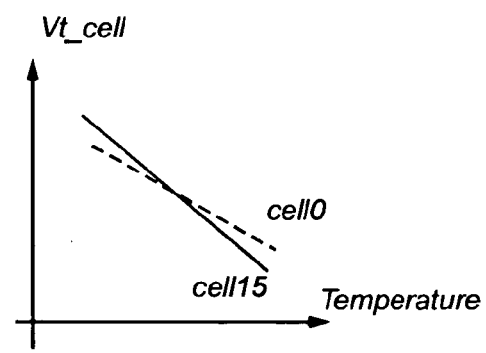

FIGS. 16A and 16B, respectively illustrate a plot of the first threshold current $I_{th1}$ and the second threshold current $I_{th2}$ for each of the extreme cell locations in the representative sixteen-cell memory cell string or chain. As illustrated, the cell locations in the string or chain of memory cells exhibit temperature variations. For example, in the second threshold current $I_{th2}$ case of FIG. 16B, cell_15 has a source voltage lower than that of cell_0 because cell_15 is located closer to a bit line than cell_0. Accordingly, as the temperature rises, the source voltage of cell_15 also lowers because the cell current decreases causing the Vt_cell to increase according to the temperature, resulting in the temperature dependence shown in FIG. 16B. Accordingly, temperature compensation relating to the location of the memory cell in the string or chain of memory cells may further contribute to an extension of the verify margin over temperature variations.

Figure 17:
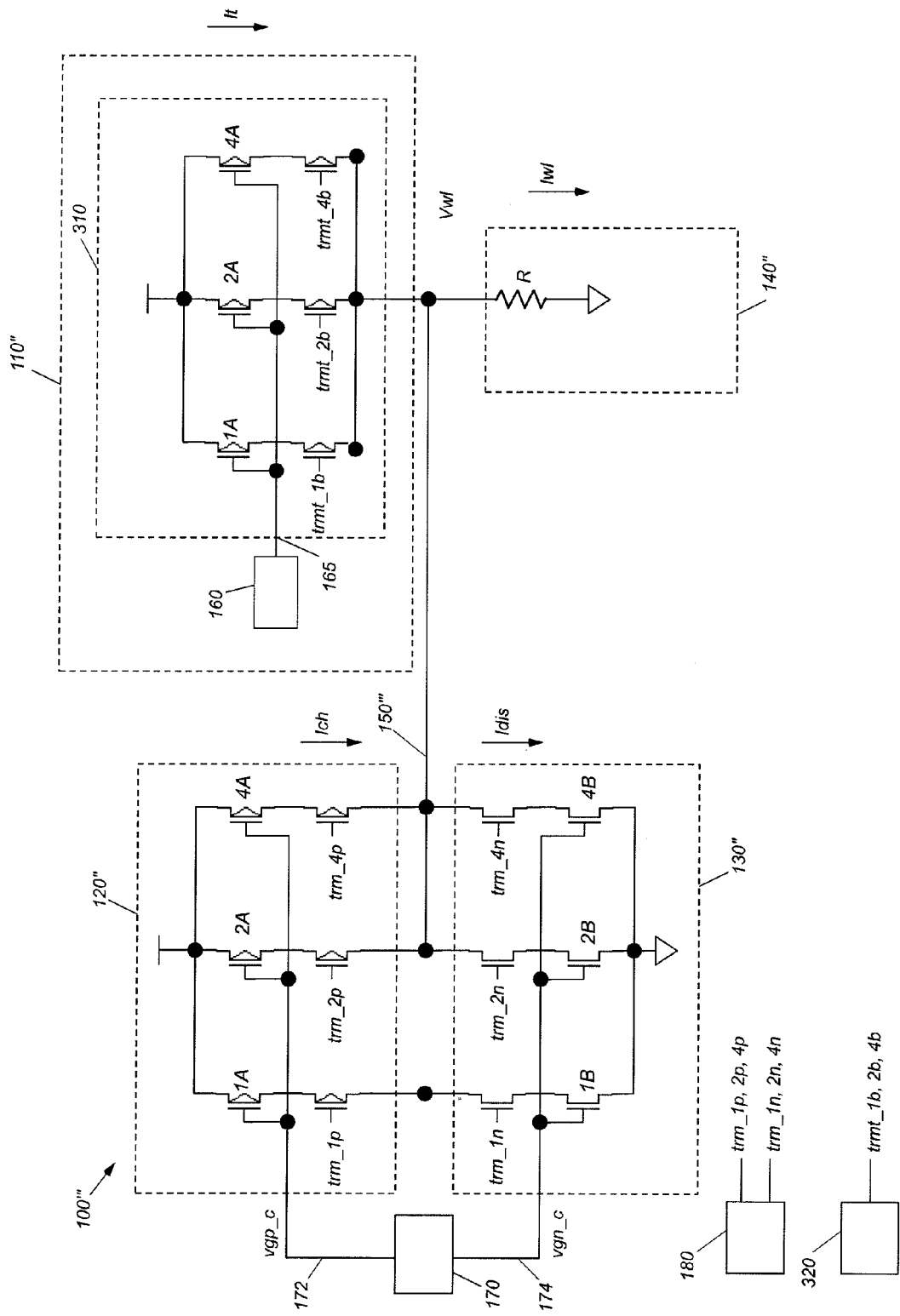
FIG. 17 is a circuit diagram of a variable current selector responsive to row address locations in a string or chain of memory cells, in accordance with a representative embodiment of the present invention.

FIG. 17 is a circuit diagram of a word-line voltage generator 100''' including a first current source 110''', an adjustable current source 120'', an adjustable current sink 130'', a voltage converter 140'', a variable current controller 170, and a variable current selector 180. In operation, the word-line generator may operate similar to the previously discussed embodiments of FIGS. 9-11, however, in the embodiment of FIG. 17, the first current source 110''' includes a word-line adjustable current source 310 coupled to the current sum node 150'''.

A variable current controller 170 and a variable current selector 180 control the adjustable current source 120'' and adjustable current sink 130''. The generated signals are operably coupled to the gates of p-channel transistors 1A, 2A, and 4A, and the n-channel transistors 1B, 2B, and 4B, respectively. P-channel transistors 1A, 2A, and 4A are configured with binary weighted gate sizes, such that 2A is twice the size of 1A and 4A is twice the size of 2A. The variable current selector 180 generates the signals trm_1p, trm_2p, trm_4p, trm_1n, trm_2n, and trm_4n. This configuration enables the variable current controller 170 to assert or negate trm_1p, trm_2p, and trm_4p to enable weighted currents onto the current sum node 150'''. By way of example and not limitation, if p-channel transistor 1A is configured to source 10 µA, p-channel transistor 2A is configured to source 20 µA, and p-channel transistor 4A is configured to source 40 µA, the adjustable current source 120'' may be configured to source a current from 0 to 70 µA.

The adjustable current sink 130'' operates in a similar fashion by controlling the binary weighted n-channel transistors 1B, 2B, and 4B. Of course, binary weighting is one representative method of creating an adjustable current source 120'' and an adjustable current sink 130''. Those of ordinary skill in the art will recognize that many other methods may be practiced within the scope of the present invention. In addition, the binary weighting may be increased or decreased to modify the dynamic range of selectable currents. By way of example and not limitation, the binary weighting may be decreased to selections of 0-3 or increased to selections of 0-15.

The variable current controller 170 may fine-tune the amount of current flowing through p-channel transistors 1A, 2A, and 4A by controlling a bias voltage on node 172 (vgp_c). Similarly, the amount of current flowing through n-channel transistors 1B, 2B, and 4B may be fine-tuned by controlling a bias voltage on node 174 (vgn_c). This fine-tuning combined with the variable weighting may be used to create a collective second current Ich that is substantially independent of temperature change, by combining each of the weighted current sources from the variable current source. Similarly, fine-tuning combined with the variable weighting may be used to create a collective third current Idis that is substantially independent of temperature change, by combining each of the weighted current sinks from the variable current sink.

The first current source 110''' may be implemented to include a matching controller 160 to control the amount of current flowing through the word-line adjustable current source 310. The matching controller 160 generates a temperature compensated bias signal 165 to control current flow through the word-line adjustable current source 310, as described hereinabove. The matching controller 160, and a word-line current selector 320 control the word-line adjustable current source 310. A temperature compensated bias signal 165 from matching controller 160 is operably coupled to the gates of p-channel transistors 1A, 2A, and 4A. P-channel transistors 1A, 2A, and 4A are configured with binary weighted gate sizes, such that 2A is twice the size of 1A and 4A is twice the size of 2A. The word-line current selector 320 generates the signals trmt_1b, trmt_2b, and trmt_4b. This configuration enables the word-line current selector 320 to assert or negate trmt_1b, trmt_2b, and trmt_4b to enable weighted currents onto the current sum node 150''' according to the word-line address.

Figure 18:
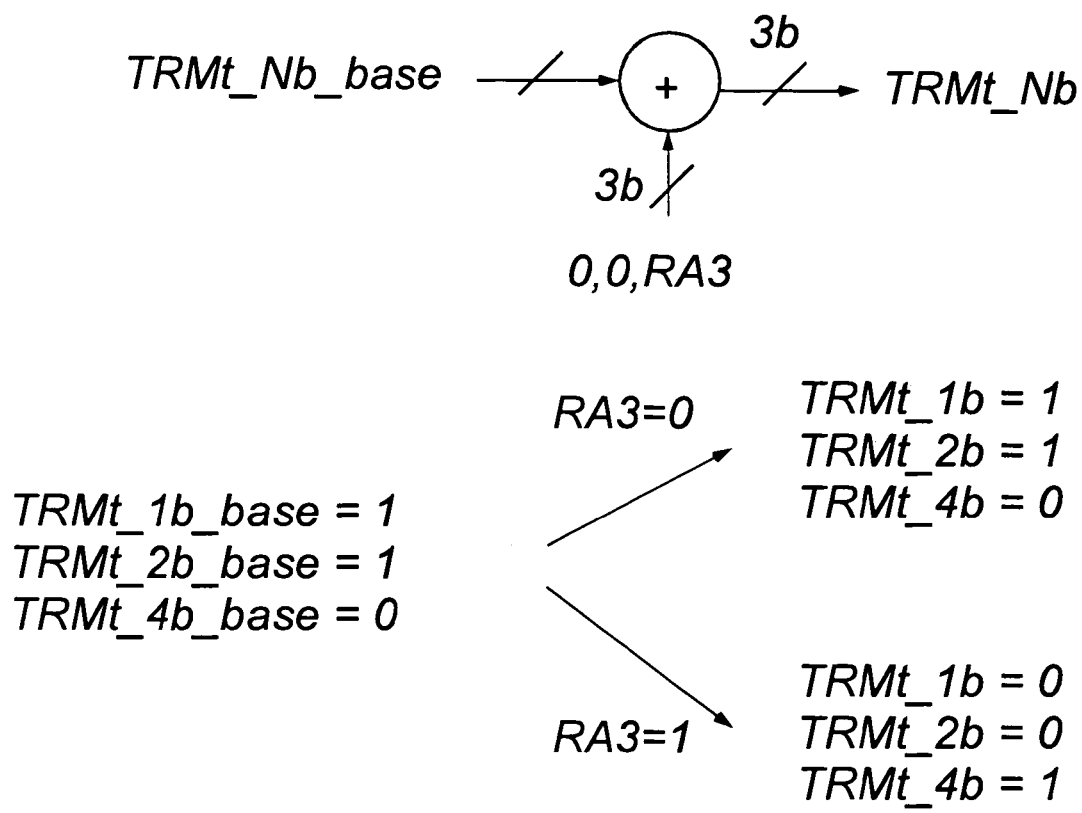
FIG. 18 illustrates the logic of a word-line current selector, in accordance with an embodiment of the present invention.

FIG. 18 illustrates the logic of word-line current selector 320, in accordance with an embodiment of the present invention. By way of example and not limitation, a word-line current selector 320 is illustrated for a representative sixteen-word-line string or chain of memory cells. As is well known, a quantity of sixteen-word-lines is uniquely addressed through the use of four binary address lines (RA3, RA2, RA1, RA0). In the present embodiment, the trmt_1b, trmt_2b, trmt_4b signals for controlling the word-line adjustable current source 310 of FIG. 17 are generated from fixed base values: trmt_1b_base=1, trmt_2b_base=1, trmt_4b_base=0 which are input into a binary summer utilizing carry addition for summing with the values: 0, 0, RA3. The summed output from the binary summer results in the control signals: trmt_1b=1, trmt_2b=1, trmt_4b=0 when RA3=0 and trmt_1b=0, trmt_2b=0, trmt_4b=1 when RA3=1.

Figure 19:
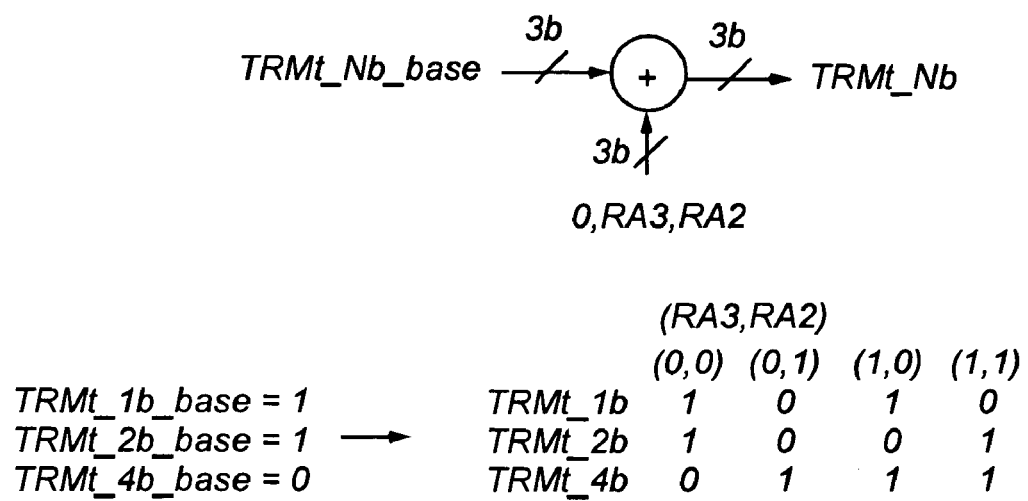
FIG. 19 illustrates the logic of a word-line current selector, in accordance with another embodiment of the present invention.

FIG. 19 illustrates the logic of word-line current selector 320, in accordance with another embodiment of the present invention. Utilizing a similar example, a word-line current selector 320 is illustrated for a representative sixteen-word-line string or chain of memory cells with a quantity of sixteen-word-lines as uniquely addressed through the use of four binary address lines (RA3, RA2, RA1, RA0). In the present embodiment, the trmt_1b, trmt_2b, trmt_4b signals for controlling the word-line adjustable current source 310 of FIG. 17 are generated from fixed base values: trmt_1b_base=1, trmt_2b_base=1, trmt_4b_base=0 which are input into a binary summer utilizing carry addition for summing with the values: 0, RA3, RA2. The summed output from the binary summer results in the control signals as illustrated in the truth table of FIG. 19.

Figure 20:
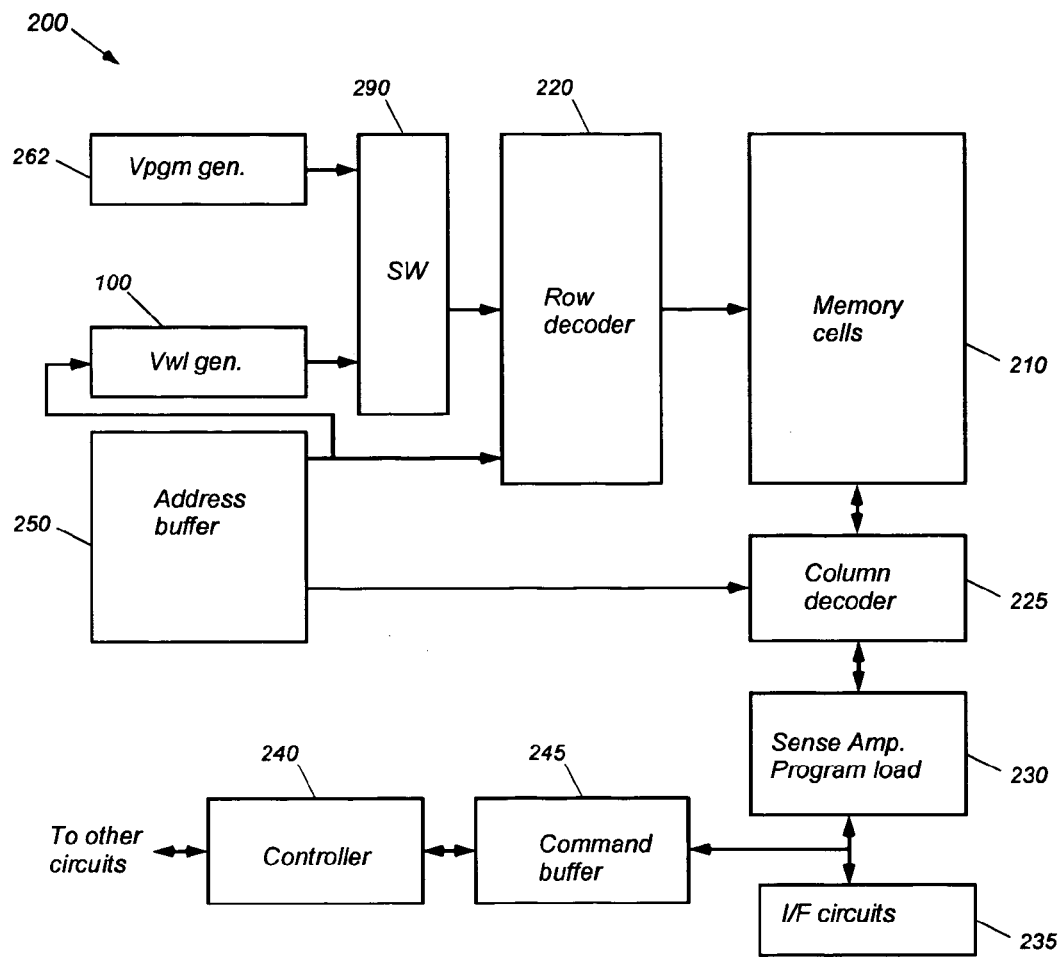
FIG. 20 is a block diagram of flash memory including a word-line voltage generator, in accordance with a representative embodiment of the present invention.

FIG. 20 is a block diagram of a representative embodiment of flash memory 200 including a word-line voltage generator 100 according to an embodiment of the present invention. The flash memory includes an array 210 of flash memory cells, a row decoder 220, for selecting appropriate word-lines based on an address input, and a column decoder 225. The selected columns are directed to a sense amp block 230 for reading. In addition, the sense amp block 230 may be used for placing appropriate voltages on the source of flash cells, the drain of flash cells, or both during programming and erasing. An interface block 235 includes circuitry to interface data input and data output between external circuitry and the sense amp block 230. A controller 240 and command buffer 245 control various operations within the flash memory and commands received from external circuitry. Address buffer 250 buffers addresses between external circuitry and the row decoder 220 and the column decoder 225. Depending on the architectural organization of the memory array 210, the address buffer 250 directs a portion of the addresses to the row decoder 220 and a portion of the addresses to the column decoder 225.

A switch 290 selects an appropriate version for the word-lines depending on the present operating mode. The voltage generator 100, generates word-line voltages for read operations and verify operations according to embodiments of the present invention. The Vpgm generator 262, generates word-line voltages for programming operations.

Figure 21:
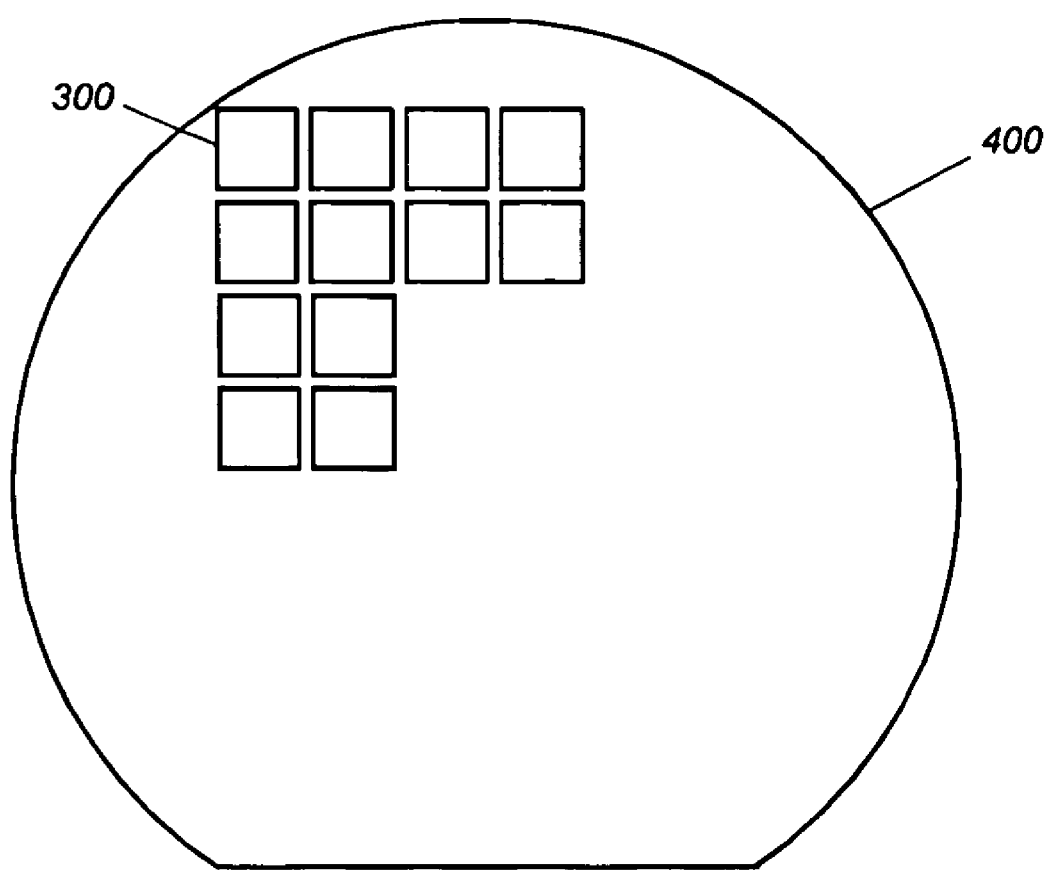
FIG. 21 is a semiconductor wafer containing a plurality of semiconductor devices containing a word-line voltage generator, in accordance with a representative embodiment of the present invention.

As shown in FIG. 21, a semiconductor wafer 400, in accordance with the present invention, includes a plurality of semiconductor memories 300, each semiconductor memory 300 incorporating at least one embodiment of the world-line voltage generators or methods described herein. Of course, it should be understood that the semiconductor memories 300 may be fabricated on substrates other than a silicon wafer, such as, for example, a Silicon On Insulator (SOI) substrate, a Silicon On Glass (SOG) substrate, and a Silicon On Sapphire (SOS) substrate.

Figure 22:
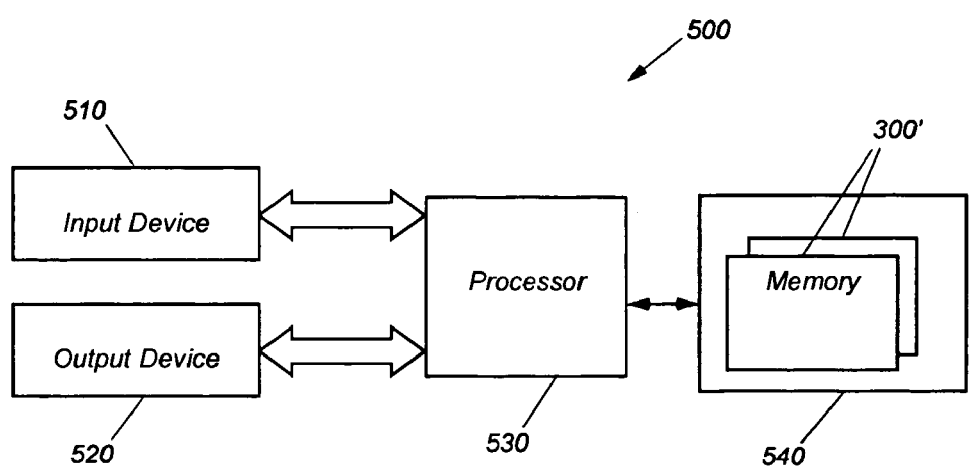
FIG. 22 is a computing system diagram showing a plurality of semiconductor memories containing a word-line voltage generator, in accordance with a representative embodiment of the present invention.

As shown in FIG. 22, an electronic system 500, in accordance with the present invention, comprises an input device 510, an output device 520, a processor 530, and a memory device 540. The memory device 540 comprises at least one semiconductor memory 300' incorporating at least one embodiment of the word-line voltage generators or methods described herein in a memory device.

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A word-line voltage generator, comprising:
    a first current source operably coupled to a current sum node and configured for generating a first current wherein a voltage derived from the first current at least partially comprises a cell location-dependent temperature coefficient varying with a location of a memory cell in a string of interconnected bit cells;
    an adjustable current source operably coupled to the current sum node and configured for generating a second current that is substantially independent of a temperature change; and
    a voltage converter operably coupled to the current sum node and configured for generating a word-line signal having a word-line voltage proportional to the first current.

2. The word-line voltage generator of claim 1, wherein the first current of the first current source further comprises a temperature coefficient substantially equal to a temperature coefficient of a threshold voltage of at least one bit cell.

3. The word-line voltage generator of claim 1, wherein the first current source comprises a plurality of current source generators configured to generate the first current at a plurality of different current source levels at least in partial response to the location of a memory cell in the string of interconnected bit cells.

4. The word-line voltage generator of claim 3, wherein each of the plurality of current source generators is further configured to generate the first current at the plurality of different current source levels at least in partial response to a temperature compensated bias signal from a matching current controller.

5. The word-line voltage generator of claim 4, wherein the matching current controller comprises:
    a matched current source for generating a first current signal and a substantially equal second current signal, wherein the temperature compensated bias signal is related to the second current signal;
    a first P-N junction element operably coupled between the first current signal and a ground; and
    a first resistance element operably coupled between the second current signal and the ground.

6. The word-line voltage generator of claim 4, wherein the matching current controller comprises:
    a matched current source for generating a first current signal and a substantially equal second current signal, wherein the temperature compensated bias signal is related to the second current signal;
    a first P-N junction element operably coupled between the first current signal and a ground; and
    a first resistance element and a second P-N junction element operably coupled in series between the second current signal and the ground.

7. The word-line voltage generator of claim 4, wherein the matching current controller comprises:

a matched current source for generating a first current signal and a substantially equal second current signal, wherein the temperature compensated bias signal is related to the second current signal;

a first P-N junction element operably coupled between the first current signal and a ground;

a first resistance element and a second P-N junction element operably coupled in series between the second current signal and the ground; and a second resistance element operably coupled between the second current signal and the ground.

8. The word-line voltage generator of claim 7, wherein the first resistance element is configured to be selectably variable and the second resistance element is configured to be selectably variable.

9. The word-line voltage generator of claim 4, wherein the matching current controller generates the temperature compensated bias signal from a biased current flowing through a flash cell substantially similar to at least one bit cell.

10. The word-line voltage generator of claim 1, wherein the cell location-dependent temperature coefficient is determined from a most-significant address bit of the location of the memory cell in the string of interconnected bit cells.

11. The word-line voltage generator of claim 1, wherein the cell location-dependent temperature coefficient is determined from a plurality of address bits of the location of the memory cell in the string of interconnected bit cells.

12. The word-line voltage generator of claim 1, wherein the adjustable current source is configured to generate a first source current during a verify process and a second source current during a read process.

13. The word-line voltage generator of claim 1, wherein the adjustable current source further comprises a plurality of current source generators configured for generating the second current at a plurality of different current source levels.

14. The word-line voltage generator of claim 13, wherein one of the plurality of different current source levels is generated during a verify process and another of the plurality of different current source levels is generated during a read process.

15. The word-line voltage generator of claim 13, wherein at least one bit cell is at least one multi-level bit cell, and wherein at least one of the plurality of different current source levels is generated for a first voltage level of the at least one multi-level bit cell, and wherein at least one additional of the plurality of different current source levels is generated for an additional voltage level of the at least one multi-level bit cell.

16. The word-line voltage generator of claim 1, further comprising an adjustable current sink operably coupled to the current sum node and configured for sinking a third current that is substantially independent of the temperature change.

17. A method, comprising:

generating a first current wherein a voltage derived from the first current at least partially comprises a cell location-dependent temperature coefficient varying with a location of a memory cell in a string of interconnected bit cells;

generating a second current, wherein the second current is substantially independent of a temperature change;

combining the first current and the second current to generate a reference current; and converting the reference current to a word-line voltage by directing the reference current through a voltage converter.

18. The method of claim 17, wherein generating the first current further comprises generating the first current wherein the voltage derived from the first current further comprises a temperature coefficient substantially equal to a temperature coefficient of a threshold voltage of at least one bit cell.

19. The method of claim 17, wherein generating a first current comprises generating a plurality of first currents at least in partial response to the location of a memory cell in the string of interconnected bit cells.

20. The method of claim 19, wherein generating the plurality of first currents is determined from a most-significant address bit of the location of the memory cell in the string of interconnected bit cells.

21. The method of claim 19, wherein generating the plurality of first currents is determined from a plurality of address bits of the location of the memory cell in the string of interconnected bit cells.

22. The method of claim 17, wherein generating the second current further comprises:

generating a first source current during a verify process; and generating a second source current during a read process.

23. The method of claim 17, further comprising:

generating a third current from an adjustable current sink, wherein the third current is substantially independent of the temperature change; and combining the third current with the first current and the second current to generate the reference current.

24. A semiconductor memory including at least one word-line voltage generator, comprising:

a first current source operably coupled to a current sum node and configured for generating a first current wherein a voltage derived from the first current at least partially comprises a cell location-dependent temperature coefficient varying with a location of a memory cell in a string of interconnected bit cells; and a voltage converter operably coupled to the current sum node and configured for generating a word-line signal having a word-line voltage proportional to the first current.

25. The semiconductor memory of claim 24, wherein the first current source comprises a plurality of current source generators configured to generate the first current at a plurality of different current source levels at least in partial response to the location of a memory cell in the string of interconnected bit cells.

26. The semiconductor memory of claim 24, wherein the cell location-dependent temperature coefficient is determined from a most-significant address bit of the location of the memory cell in the string of interconnected bit cells.

27. The semiconductor memory of claim 24, wherein the cell location-dependent temperature coefficient is determined from a plurality of address bits of the location of the memory cell in the string of interconnected bit cells.

28. A semiconductor wafer, comprising:

at least one semiconductor device including at least one word-line voltage generator, comprising:

a first current source operably coupled to a current sum node and configured for generating a first current wherein a voltage derived from the first current at least partially comprises a cell location-dependent temperature coefficient varying with a location of a memory cell in a string of interconnected bit cells; and a voltage converter operably coupled to the current sum node and configured for generating a word-line signal having a word-line voltage proportional to the first current.

29. An electronic system, comprising:

at least one input device;

at least one output device;

a processor; and a memory device comprising, at least one semiconductor memory including at least one word-line voltage generator, comprising:

a first current source operably coupled to a current sum node and configured for generating a first current wherein a voltage derived from the first current at least partially comprises a cell location-dependent temperature coefficient varying with a location of a memory cell in a string of interconnected bit cells; and a voltage converter operably coupled to the current sum node and configured for generating a word-line signal having a word-line voltage proportional to the first current.

* * * * *

UNITED STATES PATENT AND TRADEMARK OFFICE
CERTIFICATE OF CORRECTION

PATENT NO.        : 7,489,556 B2
APPLICATION NO.   : 11/433341
DATED             : February 10, 2009
INVENTOR(S)       : Tanzawa It is certified that error appears in the above-identified patent and that said Letters Patent is hereby corrected as shown below:

On the title page, item (73), in "Assignee", in column 1, line 1, delete "Bosie," and insert -- Boise, --, therefor.

Signed and Sealed this

Twenty-first Day of April, 2009

JOHN DOLL
*Acting Director of the United States Patent and Trademark Office*